(12) United States Patent
Fujikawa

(10) Patent No.: US 8,436,372 B2
(45) Date of Patent: May 7, 2013

(54) DISPLAY DEVICE

(75) Inventor: Yohsuke Fujikawa, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 173 days.

(21) Appl. No.: 13/144,165

(22) PCT Filed: Dec. 15, 2009

(86) PCT No.: PCT/JP2009/006895
§ 371 (c)(1),
(2), (4) Date: Jul. 12, 2011

(87) PCT Pub. No.: WO2010/116433
PCT Pub. Date: Oct. 14, 2010

(65) Prior Publication Data
US 2011/0273091 A1    Nov. 10, 2011

(30) Foreign Application Priority Data

Apr. 9, 2009  (JP) ................................. 2009-094844

(51) Int. Cl.
H05B 37/02 (2006.01)
H01L 51/52 (2006.01)
G02F 1/1343 (2006.01)

(52) U.S. Cl.
USPC .................................... 257/88; 257/E27.121

(58) Field of Classification Search .......... 313/495–512; 315/169.3, 169.4; 257/88, E27.121, 40, 79, 257/98; 428/690, 917; 345/30, 36, 44, 45; 252/72, 181.1, 194
See application file for complete search history.

(56) References Cited

FOREIGN PATENT DOCUMENTS

| JP | 60-119527 | 6/1985 |
|---|---|---|
| JP | 60-100784 | 7/1985 |
| JP | 2-000921 | 1/1990 |
| JP | 10-282516 | 10/1998 |
| JP | 2000-187247 | 7/2000 |
| JP | 2001-222022 | 8/2001 |
| JP | 2006-286689 | 10/2006 |
| JP | 2007-264447 | 10/2007 |
| JP | 2008-145484 | 6/2008 |

OTHER PUBLICATIONS

International Search Report for PCT/JP2009/006895, dated Feb. 16, 2010.

*Primary Examiner* — Anh Mai
*Assistant Examiner* — Elmito Breval
(74) *Attorney, Agent, or Firm* — Nixon & Vanderhye, P.A.

(57) ABSTRACT

A plurality of input terminals (4, 4a, 17) provided on a surface of a common electrode substrate (3) which surface is opposed to a TFT substrate (2) are provided so as to be opposed to a plurality of output terminals (6) provided on an external circuit substrate (5). The plurality of input terminals (4, 4a, 17) are overlapped with the plurality of output terminals (6) when the plurality of input terminals (4, 4a, 17) and the plurality of output terminals (6) are viewed in one plane, but the plurality of input terminals (4, 4a, 17) are formed so as not to overlap the TFT substrate (2). The plurality of input terminals (4, 4a, 17) and a drive circuit are electrically connected via a conductor provided between the TFT substrate (2) and the common electrode substrate (3). The plurality of input terminals (4, 4a, 17) and the plurality of output terminals (6) are electrically connected via a connector (9) having a conductive region (7) and an insulating region (8) each formed into a striped pattern on surfaces for connection with the plurality of input terminals (4, 4a, 17) and the plurality of output terminals (6). This makes it possible to attain a display device that makes it possible to suppress an increase in production cost per unit and to have a high productivity.

13 Claims, 11 Drawing Sheets

DISPLAY DEVICE

This application is the U.S. national phase of International Application No. PCT/JP2009/006895 filed 15 Dec. 2009 which designated the U.S. and claims priority to JP 2009-94844 filed 9 Apr. 2009, the entire contents of each of which are hereby incorporated by reference.

TECHNICAL FIELD

The present invention relates to a display device, such as a liquid crystal display device or an organic EL display device, which includes active elements.

BACKGROUND ART

In resent years, a display device, such as (i) a liquid crystal display device rapidly spreading in place of a Cathode Ray Tube (CRT) or (ii) an organic EL display device, including active elements is widely used in various electronics devices including televisions, monitors, mobile phones, and the like, by utilizing characteristics, such as high image quality, energy saving property, thinness, light weight, and the like, of the display device.

Such a display device includes a display panel 100 which includes a display medium such as liquid crystal molecules or organic EL molecules that are sealed between an upper substrate 101 and a lower substrate 102 as shown in FIG. 10.

In the case of a liquid crystal display device, though not shown, the upper substrate 101 is provided with a common electrode and a color filter layer. Meanwhile, the lower substrate 102 is provided with pixel electrodes and active elements (thin film transistors, thin film diodes, or the like).

Further, in recent years, in a compact display panel used for a compact electronics device such as a mobile phone, on the lower substrate 102, a scanning signal line drive circuit and a data signal line drive circuit tend to be monolithically formed for the purpose of reducing a frame area that becomes a dead space and improving reliability.

As shown in FIG. 10, an electronic signal for driving the display panel 100 of a conventional configuration is, in general, supplied to a terminal that is patterned in a metal thin film provided on the lower substrate 102, via an FPC (Flexible Printed Circuit) 104 that is connected to an external control circuit (not shown) and crimped to a terminal area 103 of the display panel 100.

Conventionally, various configurations are proposed for enhancing a variety of input terminal structures of display panels.

For example, Patent Literature 1 discloses configurations as shown in FIG. 11 in display panels 221 and 222 each employing thin film diodes (MIM elements) 204. One of the configurations is as shown in (a) of FIG. 11 and arranged such that a plurality of terminal sections 207 and 210 are gathered on a thin film diode element substrate 201. To the plurality of terminal sections 207 and 210, an external drive IC is bonded by TAB. Another one of the configurations is as shown in (b) of FIG. 11 and arranged such that the plurality of terminal sections 207 and 210 are gathered on a counter substrate 202.

In the configuration of (a) of FIG. 11, on the pixel substrate 201, a plurality of pixels 218 are arranged in a matrix form. Further, each of the plurality of pixels 218 includes a thin film diode (MIM element) for driving liquid crystals and each pixel electrode 206 is formed so as to be electrically connected to the thin film diode (MIM terminal) 204. Furthermore, on an upper side of the element substrate 201, each pad 237 that has a sufficiently wide area is formed so as to correspond to each column (in a vertical direction in (a) of FIG. 11) of pixel electrodes 206 of the pixels 218 arranged in the matrix form. To an end section of the each pad 237, a first terminal section 207 is provided.

Meanwhile, pixels 218 in each row (in a lateral direction in (a) of FIG. 11) are connected by a line 203 between pixels, and at an end section of the line 203 between pixels, a second terminal section 210 is formed.

In addition, on the counter substrate 202 provided so as to be opposed to the element substrate 201, common electrodes 209 each opposed to each column of the pixels 218 are formed. On an upper side of each of the common electrodes 209, a pad 236 is formed so as to correspond to the pad 237.

Note that, by using the pads 236 and 237, a condenser whose dielectric is made of liquid crystals is formed so as to causes a potential shift.

On the other hand, in the configuration of (b) of FIG. 11, pixels 218 in each column (in a vertical direction in (b) of FIG. 11) on the element substrate 201 are connected by a line 203 between pixels. At an end section of the line 203 between pixels, a sufficiently wide pad 216 is formed so as to correspond to a pixel electrode 206.

Further, on the counter substrate 202 provided so as to be opposed to the element substrate 201, the common electrodes 209 each arranged to be opposed to each line (in a lateral direction of (b) of FIG. 11) of pixels 218 are formed. At the end section of each of the common electrodes 209, a second terminal section 210 is formed. The common electrodes 209 are made of a transparent material such as ITO that transmits light. Moreover, each pad 217 is formed in a position opposed to the pad 216. To an end section of the each pad 217, a first terminal section 207 is provided.

According to the configurations of (a) and (b) of FIG. 11, it is possible to provide a terminal for data signal input and a terminal for scanning signal input on either one of the substrates 201 and 202. Accordingly, integration and/or simplification of connection become possible in regard to circuit members that are provided around the display panel 221 or 222 and to be connected to the terminals. Patent Literature 1 describes that, as a consequence, a size of the liquid crystal display device including the display panel 221 or 222 can be reduced.

Patent Literature 2 discloses a configuration as shown in FIG. 12. In the configuration, a lower substrate 30 is provided with a data signal line 301, a data signal line drive circuit 302 to which the data signal line 301 is connected, a scanning signal line 303, a scanning signal line drive circuit 304 to which the scanning signal line 303 is connected, a switching element 305 connected to the data signal line 301 and the scanning signal line 303, a pixel electrode 306 that is turned on/off by the switching element 305, and a group of lead wires 304a that are drawn from the data signal line drive circuit 302 and the scanning signal line drive circuit 304 for sending various signals from an outside of the panel to the data signal line drive circuit 302 and the scanning signal line drive circuit 304.

Further, on an outer side of the scanning signal line drive circuit 304 and along a side opposite to a side closely facing the data signal line drive circuit 302, a common shifting line 307 is provided. At each of diagonally opposing corners on the common shifting line 307, a common shifting electrode 308 is provided.

On the lower substrate 310, a group of video signal lines 302b is drawn from a side that is a near side or a lower side in FIG. 12 of the data signal line drive circuit 302 formed in a frame area. The group of video signal lines 302b is extended straight in a direction in which the group of video signal lines 302b is drawn, and reaches up to a position where the group of video signal lines 302b crosses a seal member 340 is provided.

At the position where the group of video signal lines 302b meets the seal member 340, bypass electrodes 302c are formed at an end of the group of video signal lines 302b.

Further, at positions the seal member 340 is provided so as to extend in parallel to an outer side of the data signal line drive circuit 302 is provided, bypass electrodes 302d are formed. The bypass electrodes 302d cross the seal member 340.

Further, on an outer side of the line along which the seal member 340 is provided, a group of lines 302e is provided. The group of lines 302e is connected to the external connecting terminals 330.

Meanwhile, a common electrode 311 is formed substantially all over a surface of the upper substrate 320 except sections corresponding to (i) a part of an area right above the data signal line drive circuit 302 of the lower substrate 310 and (ii) an area on an outer edge area of the upper substrate 320.

In an area where the common electrode 311 is not formed, a group of bypass lines 314 for the group of lead lines 302b is provided. Respective ends of the group of bypass lines 314 are connected with bypass electrodes 315 and 316.

According to the above configuration, sectional parts of some lines among the plurality of lines drawn on the lower substrate 310 are arranged to run on the upper substrate 320. Therefore, on the lower substrate 310, an area occupied by the lines can be reduced. Patent Literature 2 described that, as a result, the data signal line drive circuit 302 can be moved closer, by an amount corresponding to the reduced area, to an edge of the lower substrate 310 and consequently, a narrower frame can be attained.

CITATION LIST

Patent Literature

[Patent Literature 1]
Japanese Patent Application Publication, Tokukai, No. 2001-222022 A (published on Aug. 17, 2001)
[Patent Literature 2]
Japanese Patent Application Publication, Tokukai, No. 2007-264447 A (published on Oct. 11, 2007)

SUMMARY OF INVENTION

Technical Problem

However, according to the configuration of Patent Literature 1 as described above, on two sides of each of the display panels 221 and 222, it is necessary to provide input terminals whose number corresponding to the number of scanning signal lines and data signal lines. Therefore, in a display having a high resolution, it is difficult to form the input terminals at a wide pitch. Accordingly, in the step of providing a plurality of externally provided drive ICs by a TAB technique, highly precise alignment is required. This hampers improvement in productivity.

Patent Literature 2 discloses a configuration that achieves a narrower frame. However, Patent Literature 2 describes nothing about a configuration regarding how an output terminal of an external control circuit and an input terminal of a display panel are electrically connected.

Therefore, according to the configurations of Patent Literatures 1 and 2 above, it is not possible to attain a display device that makes it possible to improve productivity as well as suppressing part costs.

The present invention is attained in view of the above problem. An object of the present invention is to provide a display device that makes it possible to suppress an increase in production cost per unit and to have a high productivity.

Solution to Problem

In order to solve the problem mentioned above, a display device of the present invention includes: an external circuit substrate; a first substrate on which a pixel circuit and a drive circuit for the pixel circuit are monolithically formed; and a second substrate provided so as to be opposed to the first substrate, the external circuit substrate, the first substrate, and the second substrate being provided in this order so as to overlap one another, the second substrate having a plurality of input terminals on a second substrate surface being opposed to the first substrate, the external circuit substrate having a plurality of output terminals, the plurality of input terminals being provided so as to be opposed to the plurality of output terminals, and overlapped with the plurality of output terminals when the plurality of input terminals and the plurality of output terminals are viewed in one plane, the plurality of input terminals being formed so as not to overlap the first substrate, the plurality of input terminals and the drive circuit being electrically connected via a conductor provided between the first substrate and the second substrate, the plurality of input terminals and the plurality of output terminals being electrically connected via a connector having a conductive region and an insulating region each formed into a striped pattern on surfaces for connection with the plurality of input terminals and the plurality of output terminals.

According to the above configuration, in the display device, the pixel circuit and the drive circuit are monolithically formed, the number of the plurality of input terminals can be significantly reduced.

Therefore, for the reduction of the plurality of input terminals, a pitch of the plurality of input terminals provided on the second substrate surface opposed to the first substrate can be widened.

Accordingly, in the display device, it is possible to have a lower number of input and output terminals and to set terminal widths and pitches of the input and output terminals to relatively large values. Therefore, it is not necessary to connect the input terminals and the output terminals by use of an expensive FPC or the like. In place of the FPC, it is possible to use a connector having a conductive region and an insulating region each of which is formed into a striped pattern on surfaces to be connected with the input terminals and the output terminals. Such a connector is obtained at a lower cost than the FPC, and a precise alignment with respect to the input and output terminals are not required.

Consequently, simply by disposing the input terminals of the display panel including the first substrate and the second substrate, the connector onto the input terminals, and the output terminals of the external circuit substrate (control circuit) onto the connector, formation of electric connection between the input terminals and the output terminals can be completed. This makes it possible to attain a display device that makes it possible to suppress an increase in production cost per unit and to have a high productivity.

In addition, because the second substrate serves as a display surface facing a user, the control circuit does not intervene between the display panel and the user in an electronics device into which the display panel is incorporated. Therefore, such an electronics device can be convenient.

Advantageous Effects of Invention

As described above, a display device of the present invention is configured such that: the second substrate has a plurality of input terminals on a second substrate surface being opposed to the first substrate; the external circuit substrate has a plurality of output terminals; the plurality of input terminals are provided so as to be opposed to the plurality of output terminals, and overlapped with the plurality of output terminals when the plurality of input terminals and the plurality of output terminals are viewed in one plane; the plurality of input terminals are formed so as not to overlap the first substrate; the plurality of input terminals and the drive circuit are electrically connected via a conductor provided between the first substrate and the second substrate; and the plurality of input terminals and the plurality of output terminals are electrically connected via a connector having a conductive region and an insulating region each formed into a striped pattern on surfaces for connection with the plurality of input terminals and the plurality of output terminals.

Therefore, it is possible to attain a display device that makes it possible to suppress an increase in production cost per unit and to have a high productivity. In addition, because the second substrate serves as a display surface facing a user, the control circuit does not intervene between the display panel and the user in an electronics device into which the display panel is incorporated. Therefore, such an electronics device can be convenient.

DESCRIPTION OF EMBODIMENTS

The following describes in detail an embodiment of the present invention with reference to drawings. Note that each of a size, a material, a shape, a relative position, and the like of each constituent member described in this embodiment is merely one embodiment and by no means limits the scope of the present invention.

A display device of the present invention makes it possible to suppress an increase in production cost per unit and to have a high productivity.

Embodiment 1

Figure 1:
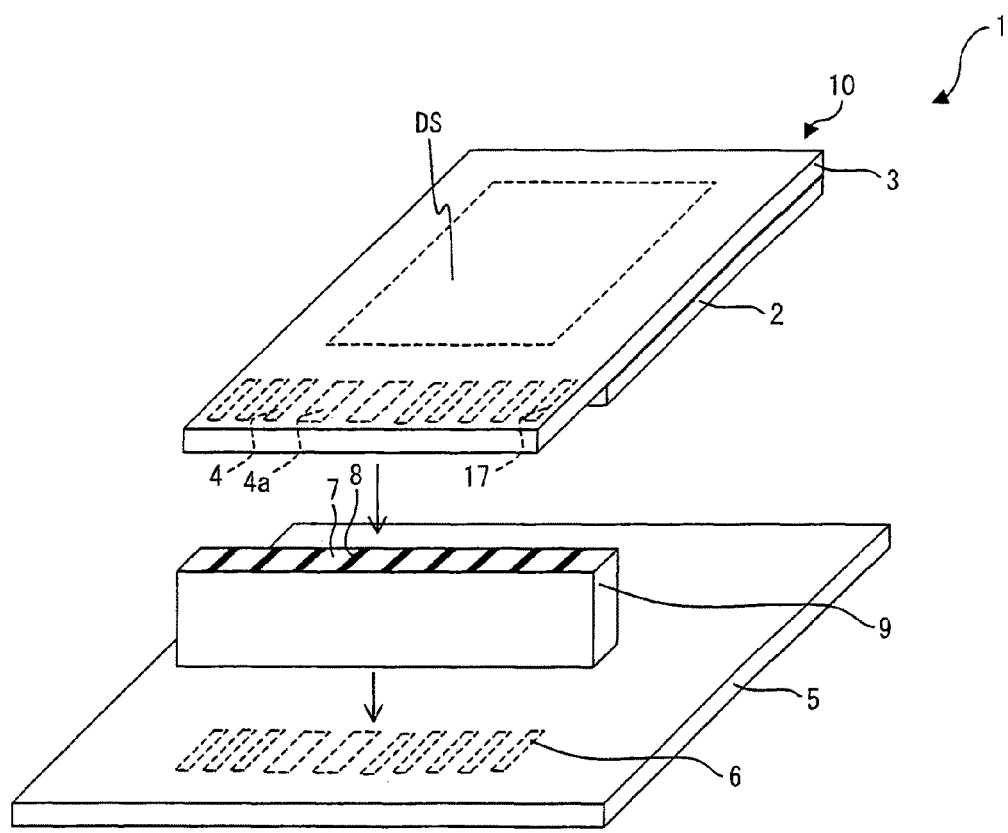
FIG. 1 is an exploded perspective view schematically illustrating a configuration of a liquid crystal display device according to one embodiment of the present invention.
Figure 2:
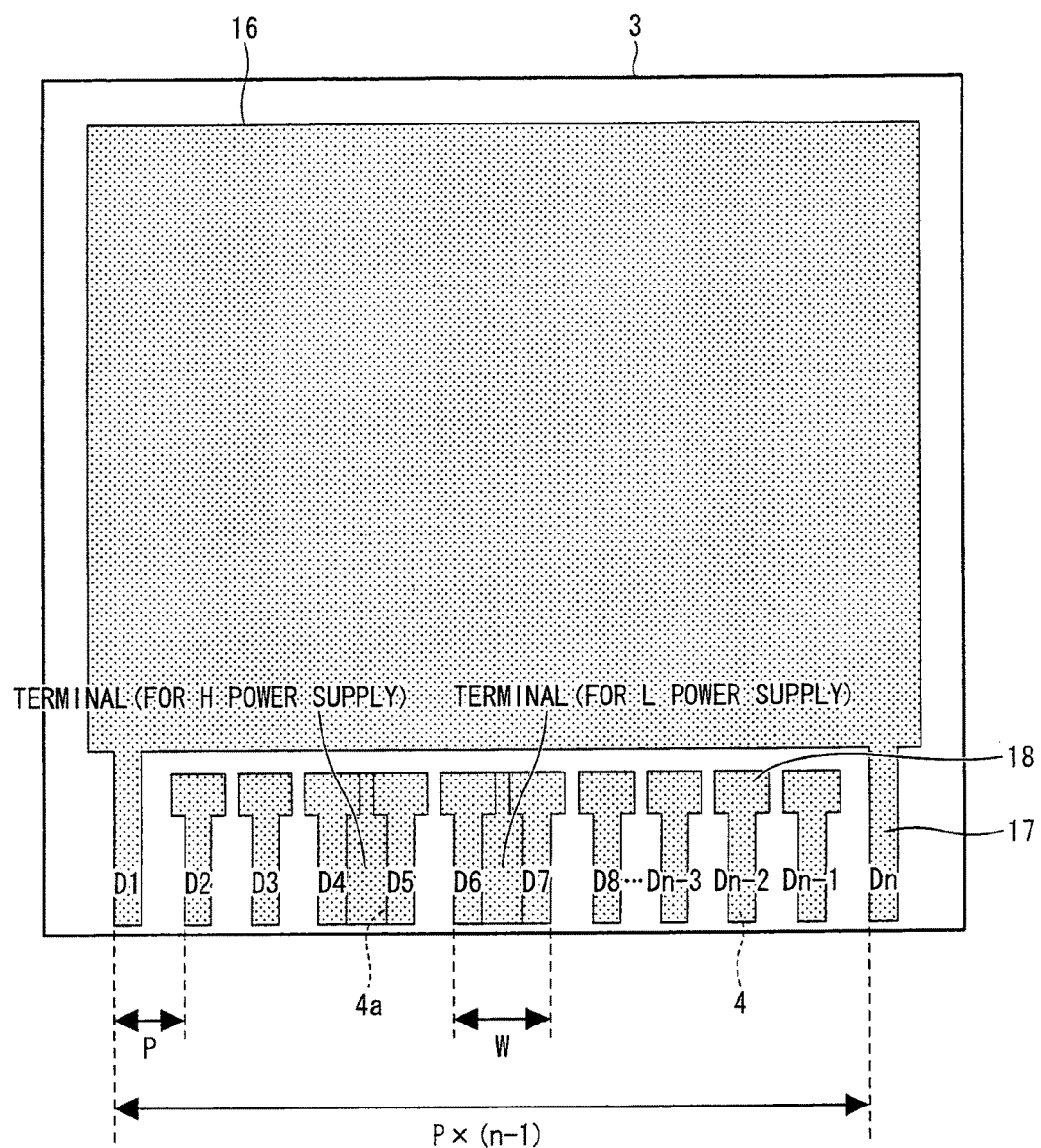
FIG. 2 is a diagram illustrating a common electrode substrate provided to a liquid crystal display device according to one embodiment of the present invention.
Figure 3:
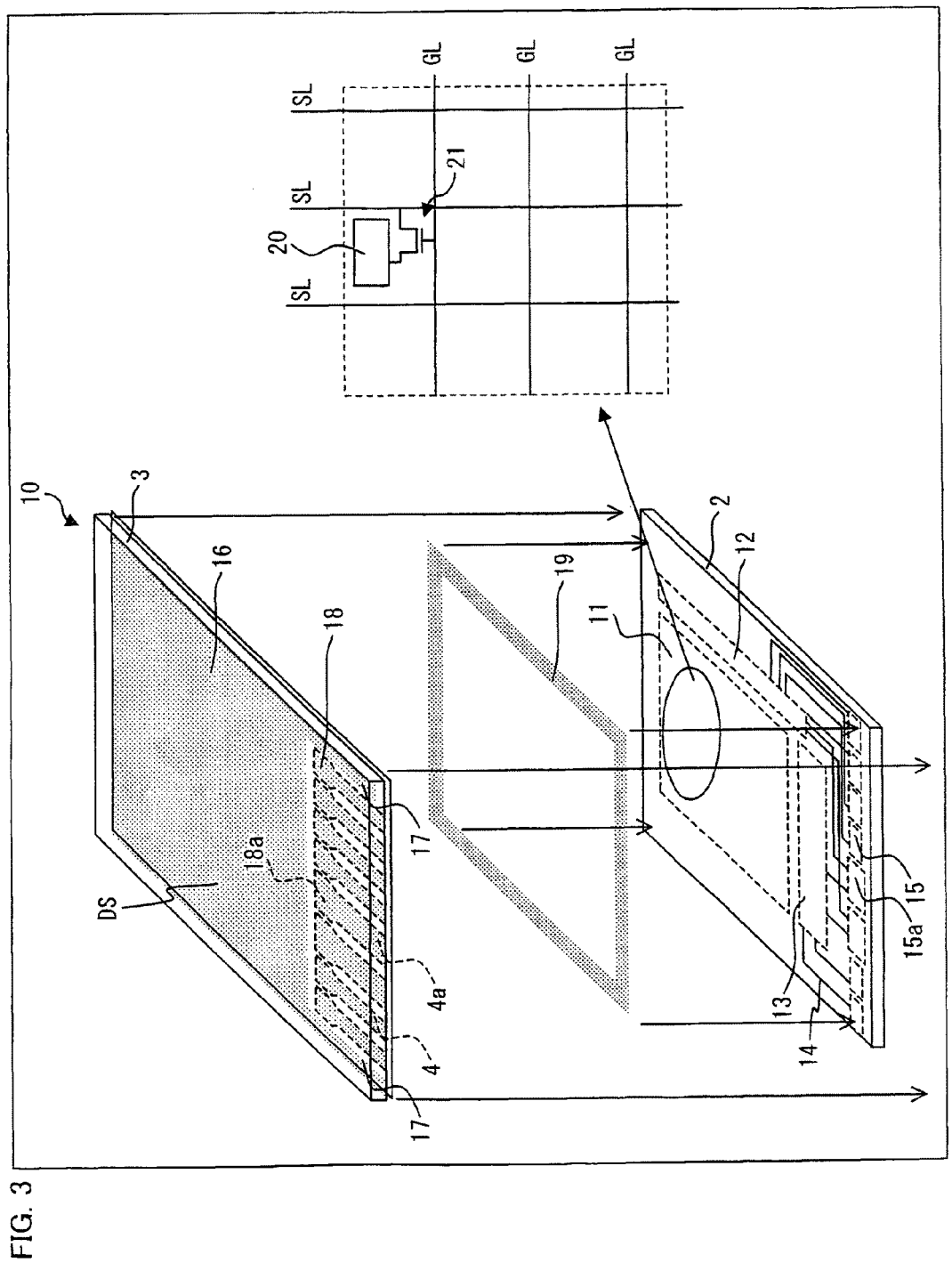
FIG. 3 is an explanatory diagram illustrating a display panel provided in a liquid crystal display device according to one embodiment of the present invention.

The following explains a configuration of a liquid crystal display device 1 according to one embodiment of the present invention, with reference to FIGS. 1 to 3.

The present embodiment explains a reflection type liquid crystal display device 1 as one example of a display device. However, the present invention is not limited to this. It is obvious that the present invention is also applicable to a self-luminous type display device, a transflective type liquid crystal display device, a transmissive type liquid crystal display device, and the like.

FIG. 1 is a configuration diagram schematically illustrating a configuration of the liquid crystal display device 1 according to one embodiment of the present invention.

As shown in FIG. 1, the liquid crystal display device 1 of the present embodiment includes a TFT substrate 2 (first substrate), a common electrode substrate 3 (second substrate), a display panel 10, and an external circuit substrate 5. The TFT substrate 2 includes a plurality of TFT elements, pixel electrodes connected to the TFT elements, and a scanning signal line drive circuit and a data signal line drive circuit each monolithically formed. The common electrode substrate 3 includes a common electrode and is provided so as to be opposed to the TFT substrate 2. The display panel 10 includes a liquid crystal layer that is sealed between the substrates 2 and 3. The external circuit substrate 5 includes a control circuit for outputting a signal for controlling the display panel 10. Note that a display surface DS in this case is provided on a side where a common electrode substrate 3 is provided.

The present embodiment explains a structure that includes a common electrode on a substrate opposed to the TFT substrate 2. However, the present invention is not limited to this structure. It is obvious that the present invention can also be applied to a case of an in-plane switching liquid crystal mode in which a counter substrate does not have a counter electrode, for example, as in an IPS mode.

In FIG. 1, the display panel 10 is provided with a plurality of input terminals 4, 4a, and 17 for inputting data signals, control signals, and power supply. These plurality of input terminals 4, 4a, and 17 are provided on a surface of the counter electrode substrate 3 which surface is opposed to the TFT substrate 2. Note that: as described later, (i) data signals and control signals are inputted into the input terminal 4 and the power supply is inputted into the input terminal 4a that is formed so as to have a greater width than other input terminals 4 and 17; and (ii) these data signals, control signals, and the power supply are transmitted to the drive circuit on the TFT substrate 2.

Meanwhile, voltage to be applied to the common electrode on the common electrode substrate 3 is inputted into the input terminal 17.

Further, the TFT substrate 2 is arranged to be shorter than the common electrode substrate 3 so that the input terminals 4, 4a, and 17 are exposed on a bottom side of the common electrode substrate 3 in FIG. 1. In other words, the common electrode substrate 3 projects like eaves with respect to the TFT substrate 2.

Further, the plurality of output terminals 6 provided on the external circuit substrate 5 are provided so that the plurality of output terminals 6 are opposed to and overlap with these input terminals 4, 4a, and 17 corresponding to the plurality of output terminals 6 in a case where the plurality of output terminals 6 and the input terminals 4, 4a, and 17 are viewed in a plane.

The input terminals 4, 4a, and 17 and the output terminals 6 are electrically connected by a zebra connector 9 that has a conductive region 7 and an insulating region 8 which are provided in a striped pattern. More specifically, each one of the input terminals 4, 4a, and 17 and corresponding one of the output terminals 6 form a pair and are electrically connected by sandwiching the conductive region 7 of the zebra connector 9.

Because the zebra connector 4 has a wide pitch size, precise alignment is not required. Further, formation of electrical connection can be completed only by disposing the input terminals 4, 4a, and 17 of the display panel 10, the zebra connector 9 onto the input terminals 4, 4a, and 17, and the output terminals 6 of the external circuit substrate 5 further onto the zebra connector 9. This makes it possible to attain a liquid crystal display device 1 that makes it possible to suppress an increase in production cost per unit and also to have a high productivity.

FIG. 2 is a diagram illustrating a planar configuration of the input terminals 4, 4a, and 17.

For driving the monolithically formed drive circuit, not only input of data signals and control signals but also input of High power supply and Low power supply are essential.

In a case where, as shown in FIG. 2, the common electrode 16 and the input terminals 4, 4a, and 17 are formed by using a thin film made of, for example, ITO (Indium Tin Oxide) or IZO (Indium Zinc Oxide) having a higher resistance as compared to metal, a process can be shortened. However, when power supply is inputted into an input terminal provided at a predetermined terminal width and at a predetermined terminal interval in patterning of such a thin film having a high resistance, a defect such as a fall in voltage occurs. Accordingly, such an input terminal is not suitable for a terminal for power supply.

Therefore, as shown in FIG. 2, two input terminals 4a for High power supply and Low power supply should be provided so as to have a terminal width W that is wider than that of the other terminals 4 and 17.

Note that a pitch P indicates an interval between preceding edges of the input terminals 4 and 17 in a direction from D1 to Dn.

As shown in FIG. 2, the input terminals 4 and 17 are provided at the pitch P, whereas the input terminals 4a for power supply are provided at a pitch 2P. The terminal width W of the input terminals 4a for power supply is increased by a sum of a width between D4 and D5 of n (D1 to Dn) input terminals 4 and 17 provided at the pitch P and a terminal width of D5, that is, by the pitch P. However, if necessary, the terminal width W may be further increased.

Note that in a case where the terminal pitch P is changed for increasing a width of a terminal, it is preferable that a width of the terminal becomes an integral multiple of the base terminal pitch P.

This is for the following reason. In general, the conductive region 7 and the insulating region 8 of the zebra connector 9 are provided at a relatively wide interval. Accordingly, it is most advantageous that the pitches of the input terminals 4, 4a, and 17 are set to a pitch corresponding to the interval of the conductive region 7 and the insulating region 8 of the zebra connector 9.

Note that as an example in which both the terminal width and the pitch are changed, the terminals for power supply is described. However, for example, as in a case where signals whose cross talk need to be avoided are to be inputted into terminals and a pitch of the terminals are to be widened, it is possible to keep the terminal width equal to previous one (unchanged) and to change (increase) only the pitch. However, because a terminal pitch that matches a zebra connector that is commercially available is relatively large, interference of signals inputted into two terminals rarely occurs. Therefore, it is substantially enough if a terminal width of a terminal for power supply or a terminal whose current is large is taken into consideration and increased.

In the above configuration, the input terminals 4, 4a, and 17 for the zebra connector 9 that is suitable for the monolithically formed drive circuit can be formed from a thin film that is transparent like the common electrode 16 provided on the common electrode substrate 3 and that is made of, for example, ITO having a relatively high resistance.

Note that in the present embodiment, two input terminals 4a whose width is widened are provided. However, the present invention is not limited to this configuration. It is obvious that the number of the input terminals 4a can be adjusted as appropriate.

As described above, in the liquid crystal display device 1, the terminal pitch P and the terminal width W are set in accordance with contents of signals to the input terminals 4, 4a, and 17.

With reference to FIG. 3, the following explains in more detail a configuration of the display panel 10 provided in the liquid crystal display device 1.

FIG. 3 is a configuration diagram schematically illustrating a configuration of the display panel 10 provided in the liquid crystal display device 1.

A surface of the TFT substrate 2 which surface is opposed to the common electrode substrate 3 is provided with a display area 11 where pixel electrodes 20 and TFT elements 21 are formed, and a scanning signal line drive circuit 12 and a data signal line drive circuit 13. The scanning signal line drive circuit 12 and the data signal line drive circuit 13 are monolithically formed by using polycrystalline silicon as a base, and provided outside the display area 11.

In the present embodiment, for a polycrystalline semiconductor film, polycrystalline silicon is used. However, a material of the polycrystalline semiconductor film is not limited to this. It is possible to use a semiconductor film that is obtained by polycrystallization of amorphous silicon, amorphous germanium, polycrystalline germanium, amorphous silicon germanium, polycrystalline silicon germanium, amorphous silicon carbide, polycrystalline silicon carbide, or the like by means of laser annealing.

Note that the laser annealing is described later in detail.

As shown in a partially enlarged view of the display area 11 in FIG. 3, the display panel 10 is provided with a plurality of pixel electrodes 20 arranged in a matrix form, a plurality of data signal lines SL, and a plurality of scanning signal lines GL intersecting the plurality of data signal lines SL. The TFT elements 21 are provided so as to correspond to respective positions where the data signal lines SL and the scanning signal lines GL intersect with each other.

Further, from a part of the output terminals 6 provided on the external circuit substrate 5 as shown in FIG. 1, video signals of an image to be displayed on the display panel 10 are outputted. The video signals are video data showing a display state of each pixel of the image. These video signals are generated based on the video data transferred in time division. Furthermore, from a plurality of other output terminals 6, source clock signals and source start pulse signals are outputted to the data signal line drive circuit 13 and gate clock signals and gate start pulse signals are outputted to the scanning signal line drive circuit 12. The source clock signals and source start pulse signals and the gate clock signals and gate start pulse signals are outputted as timing signals for appropriately displaying the video signals on the display panel 10.

The scanning signal line drive circuit 12 sequentially selects a plurality of scanning signal lines GL in synchronization with the timing signals such as the gate clock signals. Meanwhile, the data signal line drive circuit 13 operates in synchronization with the timing signals such as the source clock signals, so as to specify respective timings appropriate for the signal lines SL, sample the video signals at the respective timings, and write, to the data signal lines SL, the signals obtained as a result of the sampling.

The pixels of the display panel 10 are divided into sections in accordance with a size of the pixel electrodes 20. While a scanning signal line GL corresponding to each pixel is selected, brightness of the each pixel is controlled in accordance with data outputted to each data signal line SL corresponding to the each pixel. As a result, the image indicated by the video signals is displayed.

Though not shown in FIG. 3, in the case of the display panel 10, each liquid crystal capacitance is formed by sandwiching liquid crystals between the common electrode and a pixel electrode 20 of each pixel. However, for lengthening a period for decay of charges that are charged to the liquid crystal capacitance, it may be configured such that a storage capacitance (Cs) is connected in parallel with the liquid crystal capacitance.

Note that in the liquid crystal display device 1, preferably, the pixel electrode 20 has a light reflecting property.

According to the above configuration, even in the case of a reflection type or transflective type display device that includes the pixel electrode 20 having a light reflecting property, it is possible to attain a liquid crystal display device 1 that makes it possible to suppress an increase in production cost per unit and to have a high productivity.

Further, in the present embodiment, the pixel electrode 20 provided to the TFT substrate 2 is formed by using a substance, such as aluminum or silver, whose reflectance is high and whose resistance is low. However, a method for providing such light reflecting member is not limited to this.

Furthermore, the present invention may be arranged to be a display device whose power consumption is low, by building in a memory element below the pixel electrode 20 having a light reflecting property which pixel electrode 20 is provided in each pixel. An example of such a memory element is an SRAM. One bit of SRAM may be provided in one pixel. In a case where a tone display is to be carried out, such a display can be attained if a plurality of SRAMs are provided in each pixel. In this way, in the case of a display device in which a built-in SRAM is provided in each pixel, a power supply capacitance or a current value can be small. Therefore, such a display can suitably employ terminal connection by use of the zebra connector 9.

In addition, from the scanning signal line drive circuit 12 and the data signal line drive circuit 13, lines 14 are drawn toward an outside of the TFT substrate 2. The lines 14 are connected to first electrode pads 15 and 15a that are provided on the TFT substrate 2. Note that the lines 14 and the first electrode pads 15 and 15a constitute a conductive member.

In other words, each of the first electrode pads 15 and 15a are provided so as to correspond to each of all signal lines and power supply lines to be drawn to the outside of the TFT substrate 2. The first electrode pads 15 and 15a are provided along one edge section of the TFT substrate 2.

Meanwhile, on the common electrode substrate 3, second electrode pads 18a provided above the input terminals 4a whose width is increased as described above are formed so as to be larger than the other second electrode pads 18. The first electrode pad 15a corresponding to the second electrode pads 18a are also formed so as to be larger than the other first electrode pads 15.

As shown in FIG. 3, a part of the common electrode 16 is extended to one edge section of the counter electrode substrate 3 in which one edge section the input terminals 4 and 4a are provided. This part of the common electrode 16 becomes the input terminals 17 having the same potential as the common electrode 16.

To one side of the common electrode substrate 3 to which one side the input terminals 17 are provided, the other input terminals 4 and 4a that are electrically separated from the common electrode 16 are formed. Each of the input terminals 4 and 4a is provided with corresponding one of the second electrode pads 18 and 18a constituting the conductive member.

Note that the number of the first electrode pads 15 and 15a are the same as the number of the second electrode pads 18 and 18a. The first electrode pads 15 and 15a and the second electrode pads 18 and 18a are formed so that, when the display panel 10 is viewed in a plane, one of the first electrode pads 15 and 15a overlaps with corresponding one of the second electrode pads 18 and 18a.

A seal member 19 including an electrical conductor for electrically connecting the first electrode pads 15 and 15a and the second electrode pads 18 and 18a is described later.

According to the above configuration, on the TFT substrate 2, the scanning signal drive circuit 12 and the data signal line drive circuit 13 are monolithically formed. Accordingly, it is possible to reduce the number of input terminals 4 and 4a. Accordingly, the pitches of the input terminals 4 and 4a can be widened. As a result, the pitches of the first electrode pads 15 and 15a and the second electrode pads 18 and 18a corresponding to the input terminals 4 and 4a can be widened. As a result, an area allotted to each of the first electrode pads 15 and 15a and the second electrode pads 18 and 18a can be increased.

Therefore, according to the above configuration, it is possible to attain a liquid crystal display device 1 that makes it possible to arrange resistances to conduction of the first electrode pads 15 and 15a and the second electrode pads 18 and 18a to be sufficiently low. Further, it is not necessary to connect the display panel 10 and the output terminals 6 of the external circuit substrate 5 by use of an expensive FPC or the like. Accordingly, it becomes possible to use a low-cost zebra connector 9 that has a small number of corresponding terminals and a relatively large pitch size of the terminals.

Note that the numbers of the input terminals 4, 4a, and 17, the first electrode pads 15 and 15a, and the second electrode pads 18 and 18a in FIGS. 1 to 3 are shown merely as examples and it is obvious that these numbers can be adjusted as appropriate.

The seal member 19 as shown in FIG. 3 has a function to bond the TFT substrate 2 and the common electrode substrate 3 at a predetermined spacing and to seal a display medium. The seal member 19 is formed in a frame shape along a periphery of the TFT substrate 2. Note that a liquid crystal material is filled in a space of an inner area surrounded by the seal member 19.

The seal member 19 can be made of, for example, UV curable resin, thermosetting resin, or resin containing both of the UV curable resin and the thermosetting resin.

The seal member 19 contains a conductor such as gold particles.

According to the above configuration, in the seal member 19 having the function to bond the TFT substrate 2 and the common electrode substrate 3 at a predetermined spacing, a conductor such as gold particles is mixed in. In a case where the first electrode pads 15 and 15a and the second electrode pads 18 and 18a are electrically connected by using such a seal member 19, a resulting resistance can be a resistance at a level that does not cause any disadvantage to the circuit. This is because the first electrode pads 15 and 15a and the second electrode pads 18 and 18a have large areas as described above.

Further, as shown in FIG. 3, the first electrode pads 15 and 15a and the second electrode pads 18 and 18a are provided to a periphery section of the display panel 10 to which periphery section the seal member 19 is formed.

Therefore, according to the above configuration, the step of forming the seal member 19 for bonding the TFT substrate 2 and the common electrode substrate 3 at predetermined spacing and the step of forming a conductor for electrically connecting the first electrode pads 15 and 15a and the second electrode pads 18 and 18a can be integrated and arranged as one step. As a result, it is possible to attain a liquid crystal display device 1 that can make it possible to have a high productivity.

Furthermore, as shown in FIGS. 1 to 3, in the liquid crystal display device 1, the input terminals 4, 4a, and 17 are provided along one side on a surface of the common electrode substrate 3 which surface faces the TFT substrate 2.

According to the above configuration, the input terminals 4, 4a, and 17 are provided along one side of the common electrode substrate, formation of electrical connection can be completed only by disposing the input terminals 4, 4a, and 17 of the display panel 10, the zebra connector 9 that corresponds to the input terminals 4, 4a, and 17, and the output terminals 6 of the external circuit substrate 5 in this order in an superimposing manner. Accordingly, it becomes possible to attain a liquid crystal display device 1 that makes it possible to suppress an increase in production cost per unit and to have a high productivity.

Figure 4:
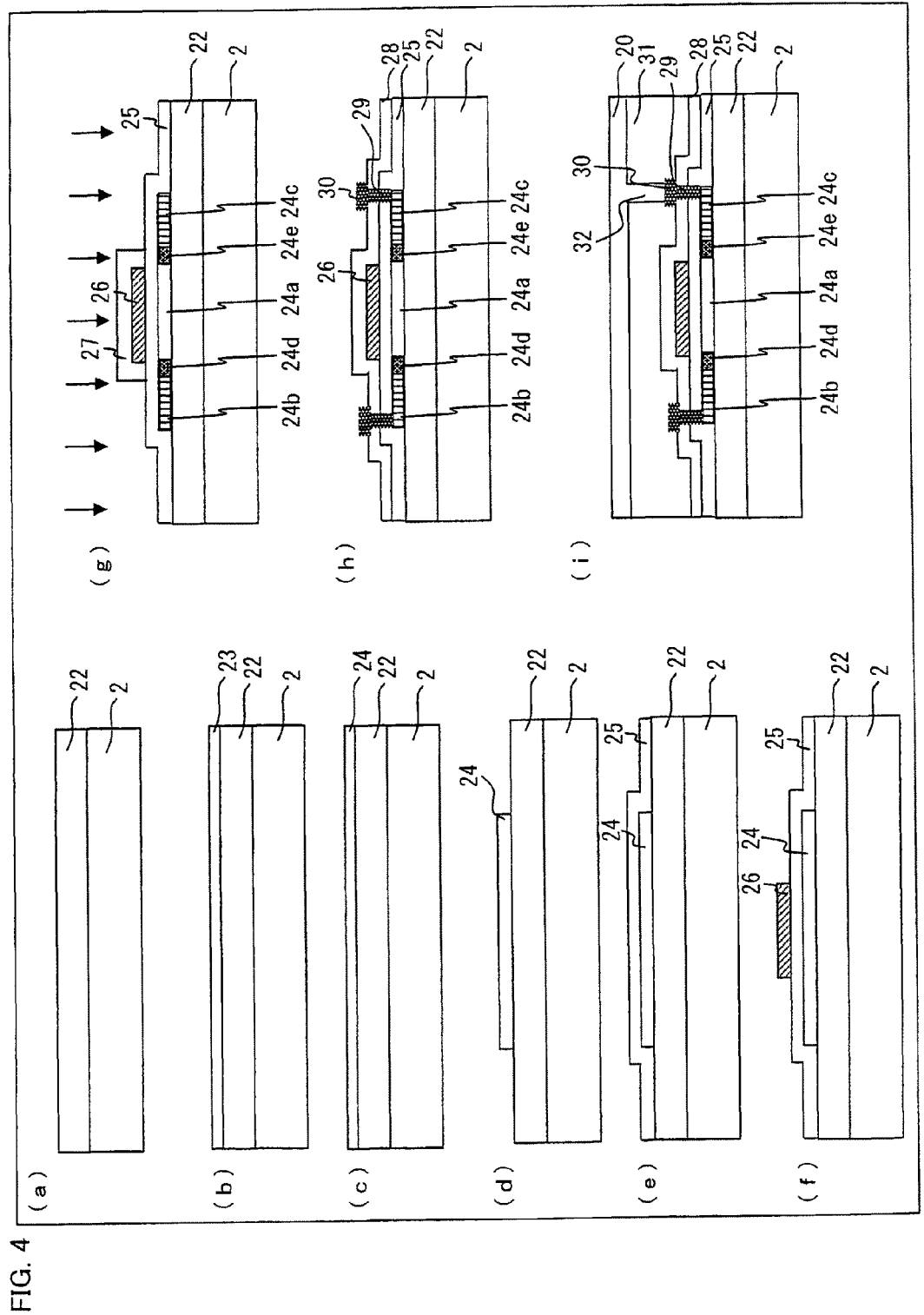
FIG. 4 is a process diagram schematically illustrating a production process of a TFT provided in a display area of a TFT substrate provided in a liquid crystal display device according to one embodiment of the present invention.

The following explains a production process of the TFT elements 21 provided on the TFT substrate 2, with reference to FIG. 4.

FIG. 4 is a process diagram schematically illustrating a production process of a TFT element 21 provided as an active element in the display area 11 of the TFT substrate 2.

In the present embodiment, as the TFT substrate 2, a transparent glass substrate is used. However, the TFT substrate 2 is not limited to this. As the substrate 2, a substrate made of quartz, plastic, or the like other than the glass substrate can be used.

First, as shown in (a) of FIG. 4, a base film 22 having a film thickness of 100 nm to 500 nm (preferably, 150 nm to 300 nm) is formed. The base film 22 can be made of, for example, an inorganic insulating film (e.g., a silicon dioxide film, a silicon nitride film, a silicon oxynitride film, etc.). Such an inorganic insulting film contains silicon and is formed by a plasma CVD (Chemical Vapor Deposition) method or a sputtering method. Moreover, the base film 22 may have a laminated structure in which a plurality of layers are laminated. In view of effective prevention of diffusion of impurity ions from the substrate 2, the base film 22 is preferably made of an inorganic insulating film, such as a silicon nitride film or a silicon oxynitride film, which contains nitrogen.

Next, as shown in (b) of FIG. 4, an amorphous semiconductor film 23 is formed by a plasma CVD method or the like. The amorphous semiconductor film 23 preferably has a film thickness of 20 nm to 100 nm.

Then, as shown in (c) of FIG. 4, a crystallized semiconductor film 24 is formed by crystallizing the amorphous semiconductor film 23 by a solid laser method or the like.

Subsequently, as shown in (d) of FIG. 4, the obtained crystallized semiconductor film 24 is subjected to patterning into a desired shape in a photolithography process, so that the crystallized semiconductor film 24 having a film thickness of 20 nm to 100 nm (preferably, 30 nm to 70 nm) can be formed.

Next, as shown in (e) of FIG. 4, a gate insulating film 25 having a film thickness of 30 nm to 150 nm (preferably, 50 nm to 100 nm) is formed so as to cover the crystallized semiconductor film 24. For lowering an interface state density at an interface between the gate insulating film 25 and the crystallized semiconductor film 24, the gate insulating film 25 is preferably made of a silicon dioxide film. This is because the crystallized semiconductor film 24 is made of silicon. Note that, if necessary, doping (channel doping) of an impurity all over the crystallized semiconductor film 24 is carried out next via the gate insulating film 25 by an ion implantation method or an ion doping method. This is for the purpose of controlling a threshold voltage of the TFT element 21. In a case where an N-channel TFT is to be formed, examples of the impurity used for the channel doping can be Group III elements such as boron (B). Meanwhile, in a case where a P-channel TFT is to be formed, examples of the impurity used for the channel doping can be Group V elements such as phosphorous (P). Further, in a case where a large-area substrate is to be treated, the ion doping method is preferably used as a method for adding the impurity.

Next, as shown in (f) of FIG. 4, a gate electrode 26 having a film thickness of 100 nm to 500 nm (preferably, 150 nm to 300 nm) is formed. This gate electrode 26 is formed by first forming a conductive film by a sputtering method and then patterning the conductive film into a desired shape by a photolithography process.

Next, as shown in (g) of FIG. 4, by using the gate electrode 26 as a mask, doping of the impurity such as boron (B) or phosphorous (P) is carried out by an ion implantation method or an ion doping method, so as to form low-concentration source regions 24d and 24b (24b will be a high-concentration source region) and low-concentration drain regions 24e and 24c (24c will be a high-concentration drain region). Note that an area masked by the gate electrode 26 becomes a channel region 24a. Further, a capping film 27 having a film thickness of 20 nm to 150 nm (preferably, 30 nm to 100 nm) is formed so as to cover the gate electrode 26. Then, by using this capping film 27 as a mask, doping of an impurity such as boron (B) or phosphorous (P) into the crystallized semiconductor film 24 is carried out in a self-aligning manner by an ion implantation method or an ion doping method, so as to form the high-concentration source region 24b and the high-concentration drain region 24c. Subsequently, high-concentration impurity regions 24b and 24c that function as source and drain regions are formed in an area except the channel region 24a, through the step of activating the crystallized semiconductor film 24. As the step of activating the crystallized semiconductor film 24, for example, a thermal treatment by use of an annealing oven or the like may be carried out or irradiation with excimer laser or the like may be carried out. The capping film 27 is not specifically limited. For example, it is possible to use, as the capping film 27, an insulating film (e.g., a silicon dioxide film, a silicon nitride film, or a silicon oxynitride film) that is formed by a plasma CVD method or a sputtering method and that contains silicon.

Furthermore, as shown in (h) of FIG. 4, by a sputtering method or a plasma CVD method, an interlayer insulating film 28 is formed so as to have a thickness of approximately 30 nm to 1500 nm. The interlayer insulating film 28 is made of a silicon dioxide film, a silicon nitride film, a silicon oxynitride film, or a lamination layer thereof.

Moreover, by carrying out a thermal treatment for approximately 30 minutes to 12 hours at a temperature in a range of 300° C. to 550° C., hydrogenation is carried out. This is a step for terminating a problem such as dangling bond of the crystallized semiconductor film 24 or the like by using hydrogen contained in the interlayer insulating film 28. The hydrogenation can be carried out also by heat treatment at a temperature in a range of 300° C. to 450° C. in a hydrogen plasma atmosphere or in an atmosphere containing hydrogen at 3% to 100%. After contact holes 29 respectively connected to the high-concentration source region 24b and the high concentration drain region 24c of the crystallized semiconductor film 24 are formed in the interlayer insulating film 28, a metal film 30 is formed on an entire upper surface of a substrate by a sputtering method or the like. As the metal film 30, for example, a laminated film including a layer of Ti having a thickness of 100 nm, a layer of Al having a thickness of 350 nm, and another layer of Ti having a thickness of 100 nm is formed. On the metal film 30, a desired resist pattern for source and drain electrodes is formed by using a photosensitive resist. Further, with use of the resist pattern as a mask, the metal film 30 is etched so that the source electrode and the drain electrode are formed. Then, the resist pattern is removed. Note that in the present embodiment, the metal film 30 is a Ti/Al/Ti laminated film. However, the metal film 30 is not specifically limited to this configuration. The metal film 30 may be formed so as to have a laminated structure as appropriate by using an element selected from Ta, W, Ti, Mo, Al, Cu, Cr, Nd, or the like which is a low-resistance metal, or an alloy material or a compound material that has the above element as a main component.

In addition, as shown in (i) of FIG. 4, a silicon oxide film or a photosensitive acrylic resin or the like which is a transparent insulating film is used as a protective insulating film 31. In the present embodiment, a photosensitive acrylic resin is used as the protective insulating film 31 and a pattern of a through hole 32 is formed.

At the end, in the present embodiment, for fabricating a reflection type liquid crystal display device 1, the following processes are carried out for the pixel electrode 20. First, a conductive film that is made of, for example, Al, Ag, or the like and that has a high reflectance and a low electric resistance is formed by a sputtering method so as to have a thickness of approximately 100 nm. By using a photosensitive resist, a desired pattern is formed. By using the resist pattern as a mask, patterning is carried out by etching the conductive film.

Note that for fabricating a transmissive type liquid crystal display device, a transparent conductive film made of ITO, IZO or the like should be used for the pixel electrode 20.

By using a production process of the TFT element 21 as described above, the scanning signal line drive circuit 12, the data signal line drive circuit 13, the first electrode pads 15 and 15a, and the like are provided outside the display area 11 of the TFT substrate 2.

Figure 5:
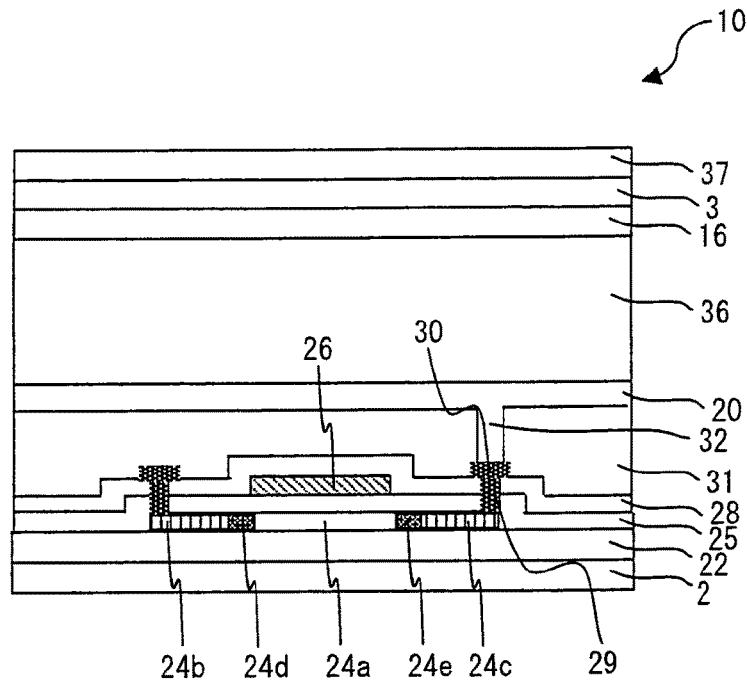
FIG. 5 is a cross sectional view schematically illustrating a display area provided in a liquid crystal display device according to one embodiment of the present invention.

FIG. 5 is a cross sectional view schematically illustrating a configuration of the display area 11 of the display panel 10 provided in the liquid crystal display device 1 according to one embodiment of the present invention.

As shown in FIG. 5, the liquid crystal display device 1 includes the TFT substrate 2 and the common electrode substrate 3 including the common electrode 16 opposed to the TFT substrate. The liquid crystal display device 1 further includes the display panel 10 having a configuration in which a liquid crystal layer 36 is sealed by the seal member 19 (not shown) between the TFT substrate 2 and the common electrode substrate 3.

Because the display panel 10 is a reflection type, only the common electrode substrate 3 is provided with a polarizer 37. However, in a case where the display panel is a transmissive type, both the TFT substrate 2 and the common electrode substrate 3 are provided with polarizers 37, respectively.

Alternatively, in a case where a bright display is desired, a liquid crystal mode that does not require a polarizer can be employed. One example of such a liquid crystal mode employs light scattering liquid crystals. Bright display can be obtained by using polymer-dispersed liquid crystals or polymer network liquid crystals. Further, in this case, because an expensive polarizer is not used, production cost can be reduced.

Further, the liquid crystal display device 1 of the present embodiment is the reflection type, no backlight is required. However, in a case where the present invention is applied to the transmissive type, a transparent conductive film made of ITO, IZO, or the like should be used for the pixel electrode 20 and a space for providing a backlight should be produced between the display panel 10 and the external circuit substrate 5 which are shown in FIG. 1.

Embodiment 2

The following explains a second embodiment of the present invention with reference to FIGS. 6 to 9. The present invention is obtained by providing a protective circuit in a liquid crystal display device of Embodiment 1. Configurations of the liquid crystal display device of the present embodiment other than providing the protective circuit is as described in Embodiment 1. For convenience of explanation, each member having an identical function as a member illustrated in drawings of Embodiment 1 is given the same reference sign and explanations thereof is omitted.

Figure 6:
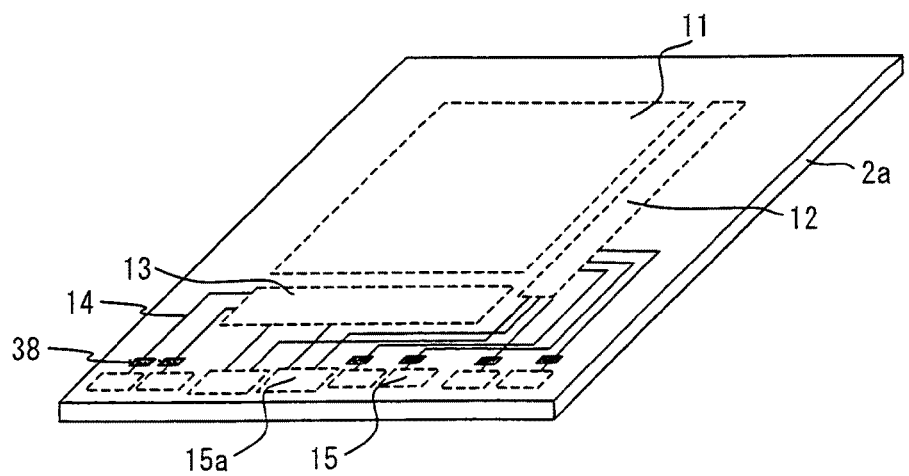
FIG. 6 is a perspective view schematically illustrating a configuration of a TFT substrate provided in a liquid crystal display device according to another embodiment of the present invention.

FIG. 6 is a plan view illustrating a configuration of a TFT substrate 2a provided in the liquid crystal display device 1 of the present embodiment.

As shown in FIG. 6, on a surface of the TFT substrate 2a which surface is opposed to a common electrode substrate 3, preferably, drive circuits 12 and 13, a protective circuit 38, first electrode pads 15 and 15a are monolithically formed so as to be electrically connected in this order.

According to the above configuration, it is possible to prevent damage to TFT elements provided in the drive circuits 12 and 13 which damage is caused by static charge or noise current creeping in from the plurality of input terminals 4 (not shown).

Note that for first electrode pads 15a electrically connected with the input terminals 4a which are equivalent to input terminals for High power supply and Low power supply as described above, the protective circuit 38 is not provided.

Further, as described above in Embodiment 1, on the first electrode pads 15 and 15a, a seal member 19 is formed. Accordingly, in the above configuration, the protective circuit 38 is formed on an inner side of the seal member 19. Therefore, the protective circuit 38 can be protected against damage or erosion due to external factors.

Further, the protective circuit 38 can be provided to each of a plurality of positions on the surface of the TFT substrate 2a which surface is opposed to the common electrode substrate 3, for example, inside the drive circuits 12 and 13.

Figure 7:
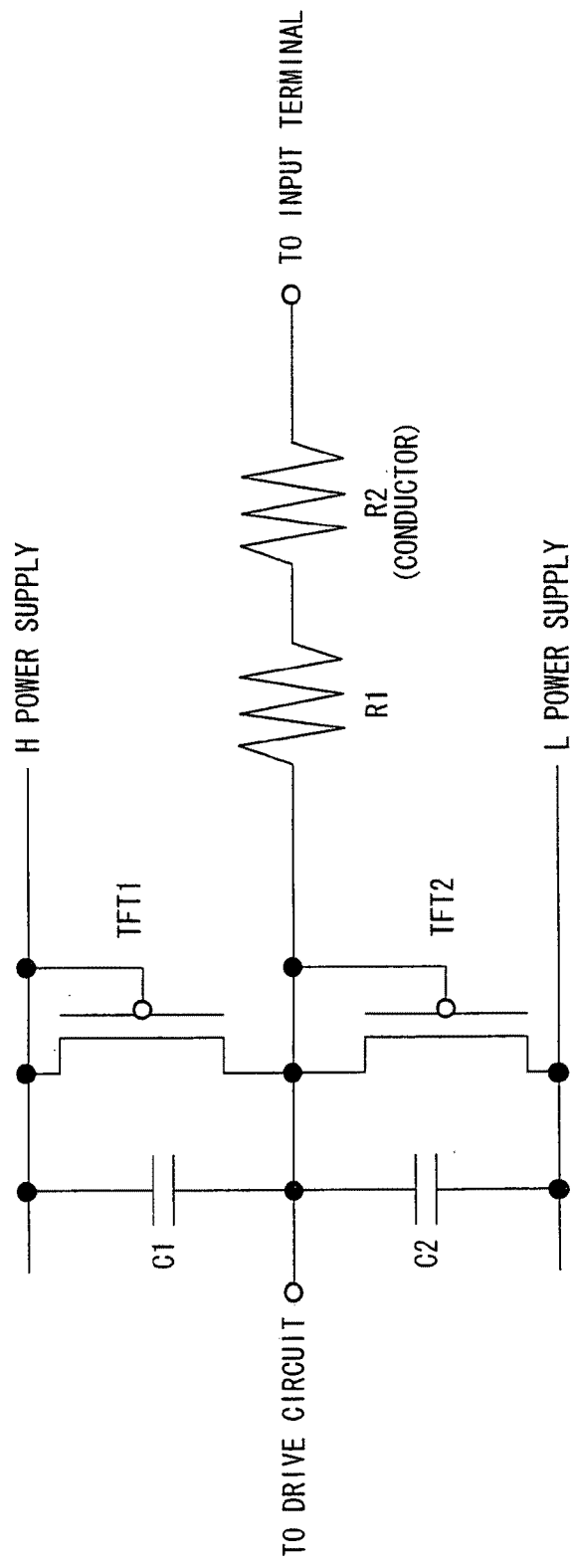
FIG. 7 is a circuit diagram illustrating one exemplary protective circuit provided in a liquid crystal display device according to another embodiment of the present invention.

FIG. 7 is a circuit diagram illustrating one example of the protective circuit 38 provided in the liquid crystal display device 1 of the present embodiment.

As shown in FIG. 7, the protective circuit 38 is provided with two transistors (TFT1 and TFT2) that are formed in the same production process as TFT elements 21 which are provided in a display area 11 as described above.

A drain electrode of one transistor (TFT1) is connected to a H power supply while a source electrode of the transistor (TFT1) is connected to a line running from an input terminal 4 to the drive circuit 12 or 13. The input terminal 4 and the drive circuit 12 or 13 are members to be protected. Further, the transistor (TFT1) is configured such that the drain electrode and a gate electrode of the transistor (TFT1) are connected to each other, and shows characteristics like characteristics of a diode.

In other words, the protective circuit 38 is configured such that, in a case where a voltage equal to or above a voltage of a H power supply is applied to the line due to static charge or the like, the transistor (TFT1) is turned on and abnormal current is removed.

Further, a drain electrode of the other transistor (TFT2) is connected to a line running from the input terminal 4 to the drive circuit 12 or 13 which are to be protected. Moreover, a source electrode of the other transistor (TFT2) is connected to an L power supply. Furthermore, like the TFT1, the transistor (TFT2) is configured such that the drain electrode and a gate electrode are connected to each other, and shows characteristics like characteristics of a diode.

Therefore, in a case where a voltage equal to or below a voltage of the L power supply is applied to the line, the transistor (TFT2) is turned on and current flows from the L power supply.

According to the above configuration, the voltage applied to the line can be always kept in a range from the voltage of the H power supply or below to the voltage of the L power supply or above. As a result, it is possible to prevent damage to TFT elements or the like provided in the drive circuits 12 and 13.

Further, as illustrated in FIG. 7, in the above protective circuit 38, resistors R1 and R2 are provided to the line running from the input terminal to the drive circuit, and capacitances C1 and C2 are provided between the line and the H power supply and between the line and the L power supply, respectively.

Therefore, even in a case where a strong voltage is instantaneously applied to the line, damage to the transistors (TFT1 and TFT2) themselves can be prevented.

In the present embodiment, the protective circuit 38 having a structure as shown in FIG. 7 is provided. However, the structure of the protective circuit 38 is not limited to this. For the protective circuit 38, various configurations are proposed and the structure may be changed as appropriate. For example, it is possible to use a protective circuit or the like made of a resistance and a transistor can be used as appropriate.

Note that many protective circuits include a circuit element corresponding to the resistor R1 shown in FIG. 7.

Figure 8:
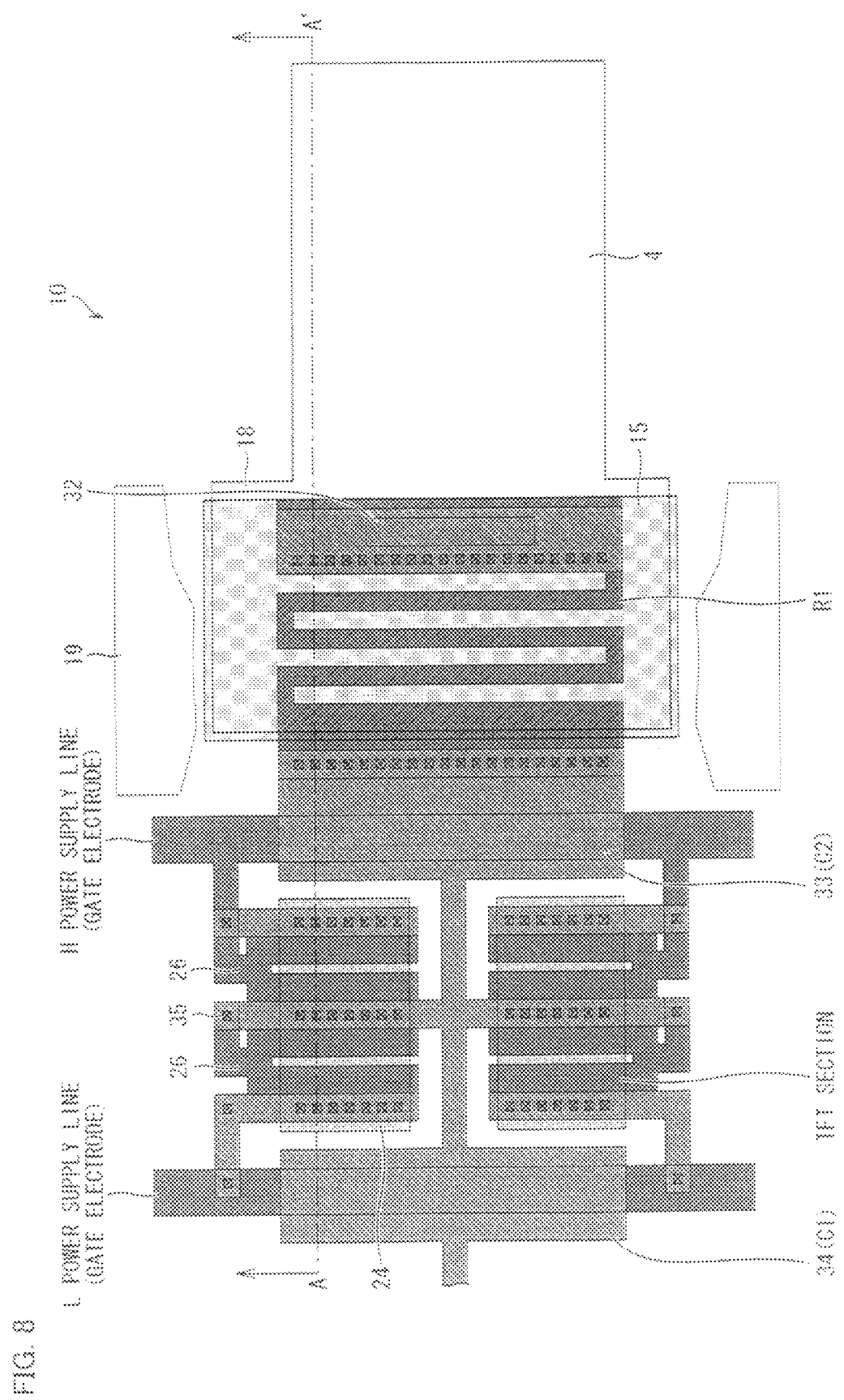
FIG. 8 is a plan view schematically illustrating a configuration in the vicinity of an input terminal of a display panel provided in a liquid crystal display device according to another embodiment of the present invention including the protective circuit of FIG. 7.

FIG. 8 is a plan view illustrating a configuration in the vicinity of the input terminal 4 of the display panel 10 including the protective circuit 38 of FIG. 7.

Figure 9:
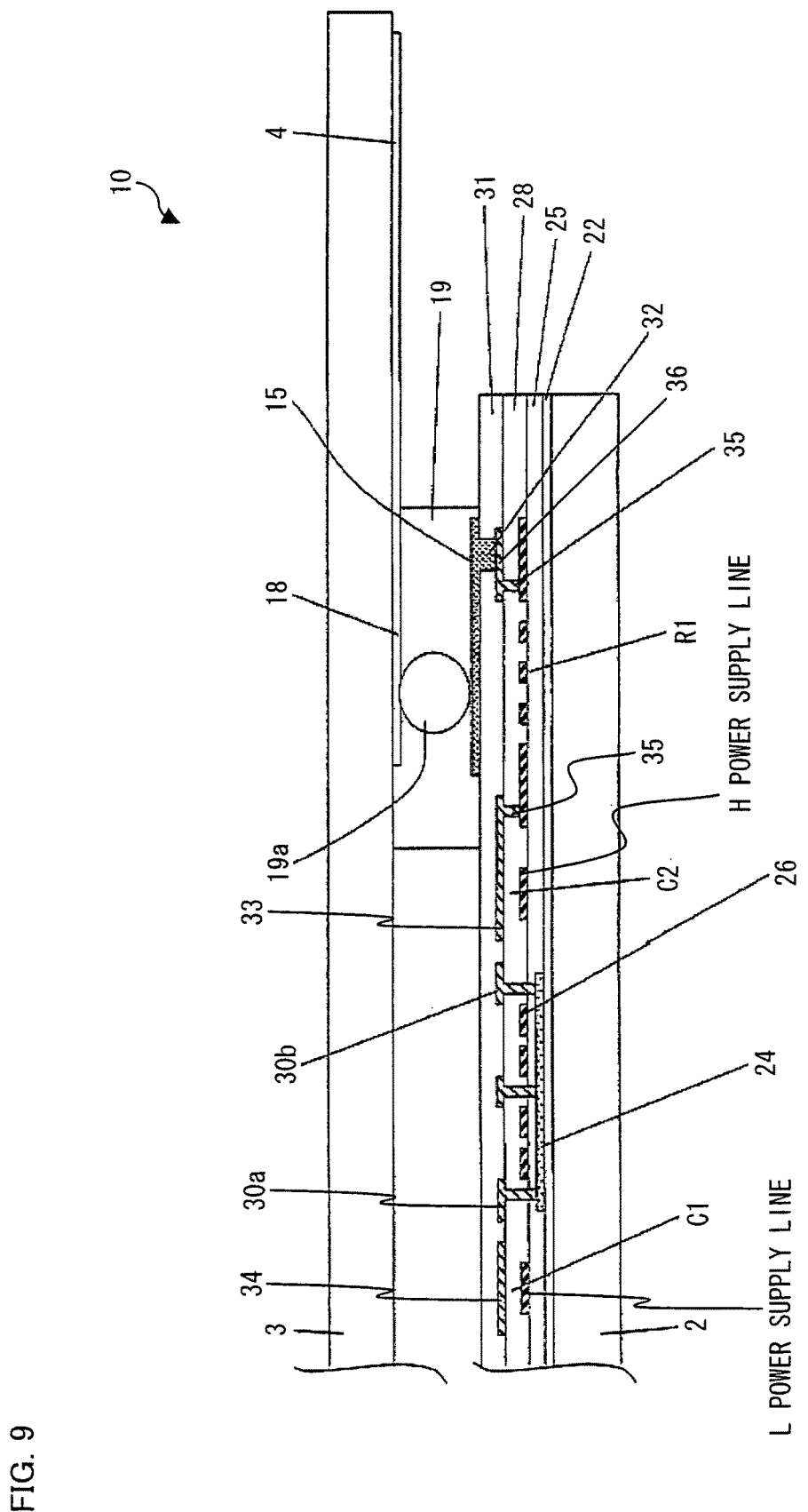
FIG. 9 is a cross sectional view taken along a line A-A' in the display panel of FIG. 8.
Figure 10:
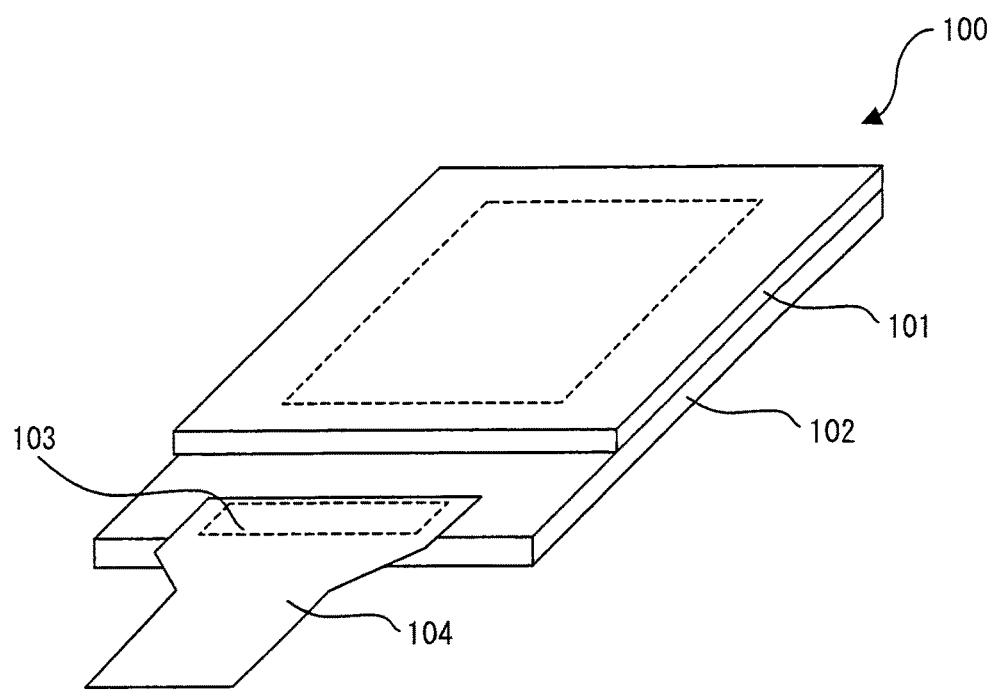
FIG. 10 is a perspective view illustrating a configuration of a conventional display panel.
Figure 11:
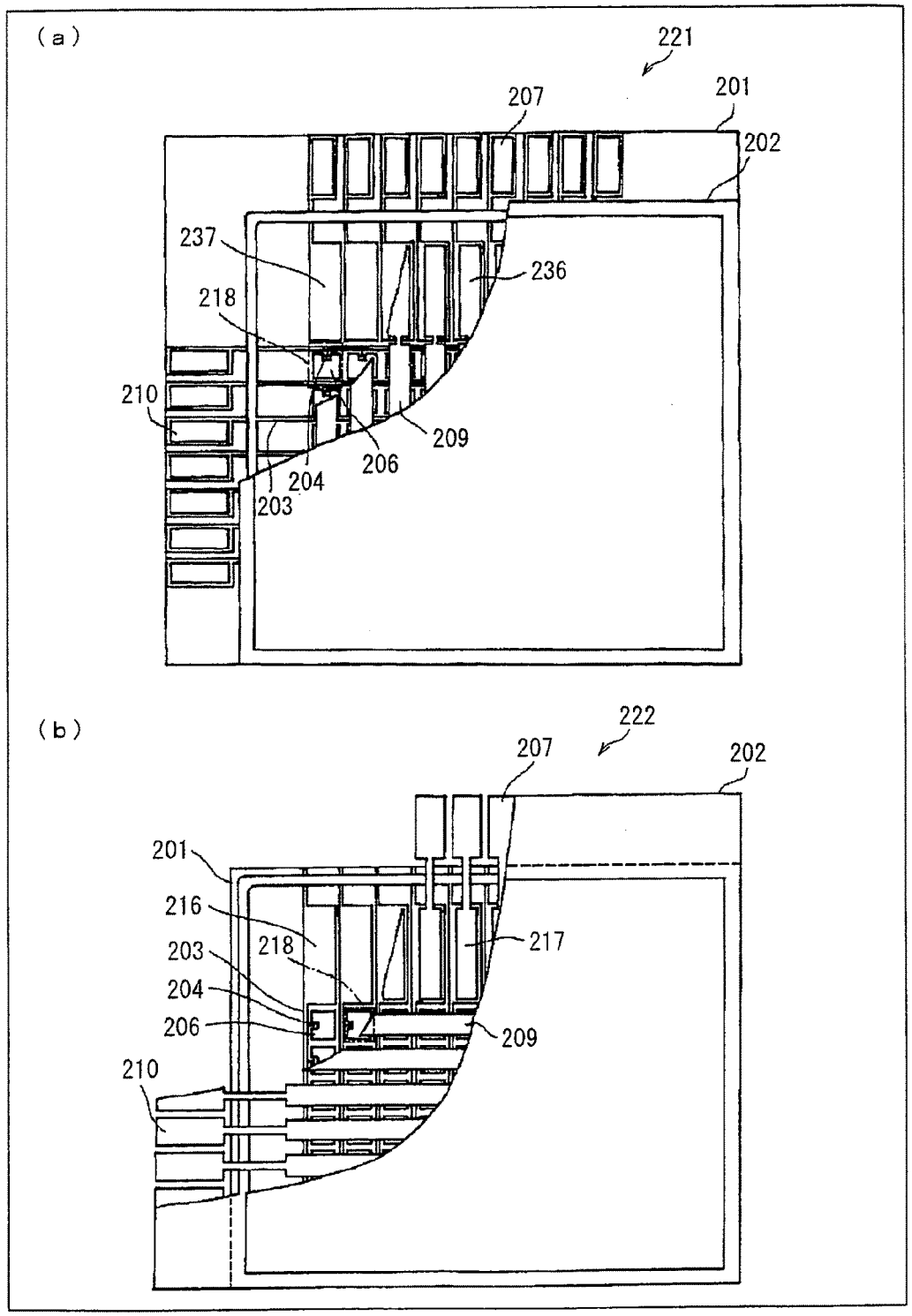
FIG. 11 is a diagram illustrating configurations of input terminals of a conventional display panel. (a) shows one exemplary configuration, while (b) shows another exemplary configuration.
Figure 12:
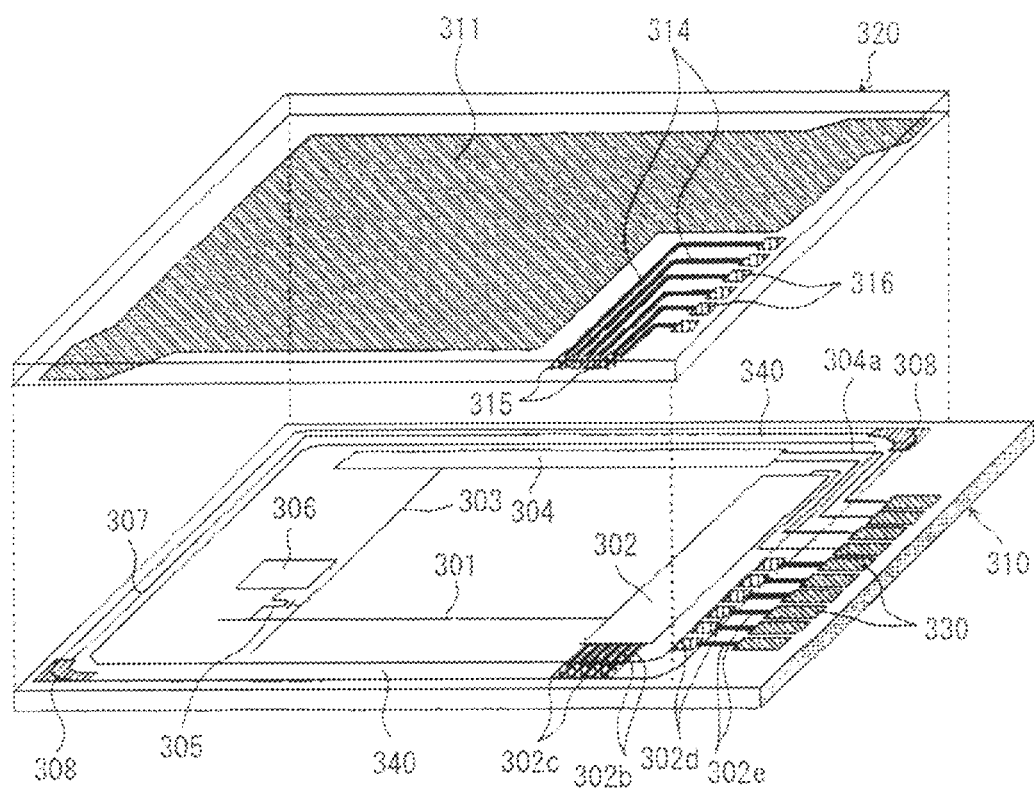
FIG. 12 is a perspective view showing one example of a configuration of input terminals of another conventional display panel.

FIG. 9 is a cross sectional view illustrating a cross sectional structure taken along a line A-A' of the display panel 10 of FIG. 8.

As shown in FIGS. 8 and 9, components between the input terminal 4 and the drive circuit 12 or 13 are connected as follows. "The input terminal 4" is connected to "the drive circuit 12 or 13" through "a second electrode pad 18", "a conductor 19a in the seal member 19", "the first electrode pad 15", and the protective circuit 38" in this order.

As shown in FIG. 9, on the TFT substrate 2, a base film 22 is formed. On the base film 22, a semiconductor film 24 is provided so as correspond to a position where a TFT section shown in FIG. 8 is formed. The semiconductor film 24 is covered by a gate insulating film 25. On the gate insulating film 25, the resistor R1, one portion of the counter electrode (a part of an L power supply line and a part of an H power supply line) for forming the capacitances C1 and C2, a gate electrode 26, the L line power supply line connected to the L power supply and the H power supply line connected to the H power supply are formed by patterning of one metal layer.

Further, the resistor R1, the portion of the counter electrode (the part of the L power supply line and the part of the H power supply line) for forming the capacitances C1 and C2, the gate electrode 26, the L power supply line connected to the L power supply and the H power supply line connected to the H power supply are covered by an interlayer protective film 28 (insulating film). On the interlayer protective film 28, metal films 33 and 34 are provided in an electrically conductive state. The metal films 33 and 34 electrically connect the resistor R1, the source electrode and the drain electrode of the TFT section as show in FIG. 8, another portion of the counter electrode for forming the capacitances C1 and C2, and a line to be protected.

The metal film 33 is connected with the resistor R1 via a contact hole 35 formed in the interlayer protective film 28.

Note that in the TFT section, the drain electrode 30a electrically connected to the H power supply line and the source electrode 30b electrically connected to the L power supply line are also formed by patterning of a metal layer for forming the metal films 33 and 34.

The resistor R1 is formed by patterning, into a meandering form, the metal layer for forming the gate electrode 26 so that the resistor R1 has a desired resistance value. Further, the capacitance C1 is formed by the metal film 34 and the L power supply line, and the capacitance C2 is formed by the metal film 33 and the H power supply line.

Moreover, the resistance R1 is electrically connected to an intermediate metal film 36 via the contact hole 35 formed in the interlayer protective film 28. The intermediate metal film 36 is electrically connected to the first electrode pad 15. The intermediate metal film 36 is also formed by patterning the metal layer for forming the metal films 33 and 34.

The metal films 33 and 34 and the intermediate metal film 36 are covered by a protective insulating film 31 (insulating layer).

On the protective film 31 above the intermediate metal film 36, the first electrode pad 15 is formed. The intermediate metal film 36 and the first electrode pad 15 are electrically connected via a through hole 32 (contact hole) formed in the protective insulating film 31.

The seal member 19 is provided so as to cover the first electrode pad 15. Via the conductor 19a contained in the seal member 19, electrical connection with the second electrode pad 18 is to be formed.

As described above, the first electrode pad 15 and the resistor R1 are connected via the contact hole 35 formed in the interlayer insulating film 28 and the through hole 32 formed in the protective insulating film 31. That is, the first electrode pad 15 is formed in a layer above the resistor R1 so that the first electrode pad 15 is provided on top of the resistor R1 via the interlayer insulating film 28 and/or the protective insulating film 31. As a result, an area occupied by the protective circuit 38 and the first electrode pad 15 can be reduced.

Therefore, a frame of the display panel 10 provided in the liquid crystal display device 1 can be made smaller.

Further, a foreign substance may be mixed in the interlayer insulating film 28 and the protective insulating film 31, when the contact hole 35 and the through hole 32 are formed. In such a case, according to the above configuration, even if the first electrode pad 15 and the resistor R1 are short-circuited, the short circuit occurs on one line. Therefore, an influence of such a short circuit is only to change a value of the resistor R1 and operations of the drive circuits 12 and 13 are hardly influenced.

Note that the configuration may be such that the protective insulating film 31, the through hole 32, and the intermediate metal film 36 are omitted and the first electrode pad 15 is formed on the interlayer insulating film 28. However, in view of arranging the first electrode pad 15 to be reliably apart from the resistor R1 and keeping the value of the resistor R1 at an appropriate value, preferably, two layers including the intermediate insulating film 28 and the protective insulating film 31 are provided. By providing these two layers, it is possible to reliably reduce a possibility of the occurrence of a short circuit between the first electrode pad 15 and the resistor R1 via the insulating layer having such a two-layer structure.

The above effect can be obtained in a case where the insulating layer of a one-layer structure that is sufficiently thick is provided. However, in such a case, it takes time for film formation. Further, fine patterning such as formation of many through holes through the insulating layer becomes difficult.

Further, in the liquid crystal display device 1, preferably, the first electrode pads 15 and 15a and the pixel electrode 20 as shown in FIG. 3 are made of an identical material and formed by patterning of one layer.

In addition, in the liquid crystal display device 1, preferably, the second electrode pads 18 and 18a and the common electrode 16 as shown in FIG. 3 are made of an identical material and formed by patterning of one layer.

According to the above configuration, the first electrode pads 15 and 15a and the pixel electrode 20 which are provided on the TFT substrate 2 or 2a, or the second electrode pads 18 and 18a and the common electrode 16 which are provided on the common electrode substrate 3 can be simultaneously formed into a predetermined pattern by using an identical material.

Therefore, it is possible to attain a liquid crystal display device 1 that shortens a production process and makes it possible to have a high productivity.

Embodiment 3

The following explains the third embodiment of the present invention. The present embodiment describes an organic EL display device and other configurations are the same as the configurations of Embodiment 1. For convenience of explanation. For convenience of explanation, each member having an identical function as a member illustrated in drawings of Embodiment 1 is given the same reference sign and explanations thereof are omitted.

It is preferable that between the TFT substrate 2 or 2a and the common electrode substrate 3, an organic light emitting layer is provided.

Though not shown, for example, a negative electrode formed from a metal film is formed on the TFT substrate 2 or 2a. Moreover, a transparent electrode (positive electrode) made of ITO, IZO, or the like is formed. The organic light emitting layer is sandwiched by the positive and negative electrodes.

According to the above configuration, it is possible to attain a self-luminous type thin display device having a wide viewing angle and a high contrast ratio.

In the display device of the present invention, preferably, the plurality of input terminals each has a terminal width set in accordance with a content of a signal to be inputted into each of the plurality of input terminals.

In the display device of the present invention, preferably, the plurality of input terminals each has a pitch set in accordance with a content of a signal to be inputted into each of the plurality of input terminals.

In the display device of the present invention, preferably, an input terminal into which a power supply signal is to be inputted is formed so as to have a greater terminal width as compared to terminal widths of other input terminals into each of which other signal is to be inputted.

For driving a monolithically formed pixel circuit and drive circuit for the pixel circuit, not only data signals, control signals, and the like but also power supply are essential However, in a case where input terminals are provided at a predetermined terminal width and at a predetermined interval by using a thin film made of, for example, ITO (Indium Tin Oxide) that has a greater resistance as compared to metal and such an input terminal is used as a power supply terminal, a defect such as a voltage fall may occur at the power supply terminal.

Further, in a case where signals whose cross talk should be avoided are to be inputted into terminals, there is a case where a pitch of such terminals is preferably set wider.

According to the above configuration, in accordance with contents of signals to be inputted into the input terminals, it is possible to set a terminal width and a pitch of the input terminals.

Further, according to the above configuration, for example, by forming an input terminal for power supply so that the input terminal for power supply becomes wider than input terminals for data signals and control signals and thereby reducing a resistance of the input terminal for power supply, it is possible to suppress the occurrence of a defect such as a voltage fall or the like at the power supply terminal.

In the display device of the present invention, preferably, the first substrate has a first electrode pad provided on a first substrate surface being opposed to the second substrate, the first electrode pad being electrically connected to the drive circuit; the second substrate has a second electrode pad provided on the second substrate surface being opposed to the first substrate, the second electrode pad being electrically connected to corresponding one of the plurality of input terminals; and the plurality of input terminals and the drive circuit are connected by electrical connection of the first electrode pad and the second electrode pad via the conductor provided between the first electrode pad and the second electrode pad.

According to the above configuration, each input terminal and the drive circuit are electrically connected via the first electrode pad, the second electrode pad, and the conductor between the first and second electrode pads.

In the display device, because the pixel circuit and the drive circuit are monolithically formed, the first electrode pad and the second electrode can take a larger area.

Accordingly, a resistance that occurs in a case where the first electrode pad and the second electrode pad are electrically connected can be set to a resistance at a level that does not cause any disadvantage on the circuit.

In the display device of the present invention, preferably, the conductor is contained in a seal member for bonding the first substrate and the second substrate.

According to the above configuration, in the seal member having a function to bond the first substrate and the second substrate at a predetermined spacing, a conductor such as gold particles is contained.

Therefore, according to the above configuration, the step of forming the seal member for bonding the first substrate and the second substrate at a predetermined spacing and the step of electrically connecting the drive circuit and the input terminal can be integrated into one step. This makes it possible to attain a display device that makes it possible to have a high productivity.

In the display device of the present invention, preferably, the drive circuit and the first electrode pad are electrically connected via a protective circuit.

According to the above configuration, because the protective circuit is provided on the first substrate that is provided with the drive circuit, it is possible to prevent damage to an active element provided in the drive circuit which damage is caused by static charge or noise current that creeps in from the input terminals.

In the display device of the present invention, preferably, the protective circuit includes a resistor; the first electrode pad is provided on an insulating layer so that the first electrode pad overlaps the resistor, the insulating layer being provided so as to cover the resistor; and the first electrode pad and the resistor are electrically connected via a contact hole formed through the insulating layer.

According to the above configuration, in a layer above the resistor, the first electrode pad is provided so as to overlap the resistor via the insulating layer. Therefore, it is possible to reduce an area occupied by the protective circuit and the first electrode pad.

As a result, a size of a frame of the display device can be reduced.

Further, when a contact hole is formed, a foreign substance may be mixed in the insulating layer, when the contact hole is formed. In such a case, according to the above configuration, even if the first electrode pad and the resistor are short-circuited, the short circuit occurs on one line. This provides an advantage such that an influence of such a short circuit is only to change a value of the resistor and operations of the drive circuit are hardly influenced.

In the display device of the present invention, preferably, the insulating layer is made of at least two layers.

According to the above configuration, the insulating layer has a multilayer structure. Therefore, the insulating layer has a structure that arranges the first electrode pad and the resistor to be reliably apart from each other.

This makes it possible to reliably lower a possibility of the occurrence of a short circuit between the first electrode pad and the resistor via the insulating layer having such a multilayer structure.

The above effect can be obtained in a case where the insulating layer of a one-layer structure that is sufficiently thick is provided. However, the above configuration makes it possible to avoid a problem of the one-layer structure such that (i) it takes time for film formation and (ii) fine patterning including formation of contact holes becomes difficult.

In the display device of the present invention, preferably, the protective circuit is configured to include the resistor, a transistor, and a capacitance.

According to the above configuration, even in a case where a strong voltage is instantaneously applied, damage to the transistor provided in the protective circuit can be prevented. Further, it is also possible to prevent damage to an active element provided in the drive circuit which damage is caused by static charge or noise current creeping in from the input terminals.

Preferably, the display device of the present invention further includes a liquid crystal layer between the first substrate and the second substrate.

Preferably, the display device of the present invention further includes an organic light emitting layer between the first substrate and the second substrate.

In the display device of the present invention, preferably, the first substrate has a pixel electrode for application of voltage across the liquid crystal layer; the second substrate has a common electrode for the application of voltage across the liquid crystal layer; the pixel electrode are made of a same material as a first electrode pad and formed by patterning of a layer where the first electrode pad is provided, the first electrode pad being electrically connected to the drive circuit and provided on the first substrate surface being opposed to the second substrate; and the common electrode is made of a same material as a second electrode pad and formed in patterning of a layer where the second electrode pad is provided, the second electrode pad being electrically connected to corresponding one of the plurality of input terminals and provided on the second substrate surface being opposed to the first substrate.

According to the above configuration, the first electrode pads and the pixel electrode which are provided on the first substrate, or the second electrode pads and the common electrode which are provided on the second substrate can be formed by using an identical material and simultaneously formed into a predetermined pattern.

Therefore, it is possible to attain a liquid crystal display device whose production process is shortened and that makes it possible to have a high productivity.

In the present display device, preferably, the pixel electrode has a light reflecting property.

According to the above configuration, even in the case of a reflection type or transflective type display device including the pixel electrode having a light reflecting property, it is possible to attain a display device that makes it possible to suppress an increase in production cost per unit and to have a high productivity.

In the display device of the present invention, preferably, the plurality of input terminals are provided along an edge on one side of the second substrate surface being opposed to the first substrate.

According to the above configuration, the input terminals are provided in a gathered manner along one side of the second substrate. Accordingly, formation of electrical connection can be completed simply by disposing the input terminals, one connector on the input terminals, and the output terminals on the connector. This makes it possible to attain a display device that makes it possible to suppress an increase in production cost per unit and that makes it possible to have a high productivity.

In the display device of the present invention, preferably, the first substrate has a memory element for storing a video signal inputted via the plurality of output terminals and the plurality of input terminals According to the above configuration, for example, in a case where one image is displayed for a predetermined time on the display device, a video signal stored in the memory element can be used. This makes it possible to attain a display device whose voltage consumption is low.

Note that in such a display device, a power supply capacitance and a current value can be set at lower values. Therefore, such a display device is suitable for terminal connection by use of a connector as described above.

One example of the memory element is an SRAM. However, the memory element is not limited to this.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to display devices such as liquid crystal display devices and organic EL display devices.

REFERENCE SIGNS LIST 1 liquid crystal display device (display device)
2, 2a TFT substrate (first substrate)
3 common electrode substrate (second substrate)
4,4a, 17 input terminal
5 external circuit substrate
6 output terminal
7 conductive region
8 insulating region
9 zebra connector (connector)
10 display panel
11 display area
12 scanning signal line drive circuit
13 data signal line drive circuit
14 line
15, 15a first electrode pad
18 common electrode
18, 18a second electrode pad
19 seal member
19a conductor
20 pixel electrode
21 TFT element
28 interlayer protective film (insulating layer)
29, 35 contact hole
31 protective insulating film (insulating layer)
32 through hole (contact hole)
38 protective circuit
R1 resistance in protective circuit (resistor)
C1, C2 capacitance in protective circuit (capacitance)
TFT1, TFT2, TFT section transistor in protective circuit (transistor)
GL scanning signal line
SL data signal line
P pitch
W terminal width

The invention claimed is:

1. A display device comprising:
an external circuit substrate;
a first substrate on which a pixel circuit and a drive circuit for the pixel circuit are monolithically formed; and
a second substrate provided so as to be opposed to the first substrate,
the external circuit substrate, the first substrate, and the second substrate being provided in this order so as to overlap one another,
the second substrate having a plurality of input terminals on a second substrate surface being opposed to the first substrate,
the external circuit substrate having a plurality of output terminals,
the plurality of input terminals being provided so as to be opposed to the plurality of output terminals, and overlapped with the plurality of output terminals when the plurality of input terminals and the plurality of output terminals are viewed in one plane,
the plurality of input terminals being formed so as not to overlap the first substrate,
the plurality of input terminals and the drive circuit being electrically connected via a conductor provided between the first substrate and the second substrate,
the plurality of input terminals and the plurality of output terminals being electrically connected via a connector having a conductive region and an insulating region each formed into a striped pattern on surfaces for connection with the plurality of input terminals and the plurality of output terminals,
wherein the first substrate has a first electrode pad provided on a first substrate surface being opposed to the second substrate, the first electrode pad being electrically connected to the drive circuit,
wherein the second substrate has a second electrode pad provided on the second substrate surface being opposed to the first substrate, the second electrode pad being electrically connected to corresponding one of the plurality of the input terminals,
wherein the plurality of input terminals and the drive circuit are connected by electrical connection of the first electrode pad and the second electrode pad via the conductor provided between the first electrode pad and the second electrode pad,
wherein the drive circuit and the first electrode pad are electrically connected via a protective circuit,
wherein the protective circuit includes a resistor,
wherein the first electrode pad is provided on an insulating layer so that the first electrode pad overlaps the resistor, the insulating layer being provided so as to cover the resistor, and
wherein the first electrode pad and the resistor are electrically connected via a contact hole formed through the insulating layer.

2. The display device as set forth in claim 1, wherein:
the plurality of input terminals each has a terminal width set in accordance with a content of a signal to be inputted into each of the plurality of input terminals.

3. The display device as set forth in claim 1, wherein:
the plurality of input terminals each has a pitch set in accordance with a content of a signal to be inputted into each of the plurality of input terminals.

4. The display device as set forth in claim 1, wherein an input terminal into which a power supply signal is to be inputted is formed so as to have a greater terminal width as compared to terminal widths of other input terminals into each of which other signal is to be inputted.

5. The display device as set forth in claim 1, wherein the conductor is contained in a seal member for bonding the first substrate and the second substrate.

6. The display device as set forth in claim 1, wherein: the insulating layer is made of at least two layers.

7. The display device as set forth in claim 1, wherein:
   the protective circuit is configured to include the resistor, a transistor, and a capacitance.

8. The display device as set forth in claim 1, further comprising:
   a liquid crystal layer between the first substrate and the second substrate.

9. The display device as set forth in claim 8, wherein:
   the first substrate has a pixel electrode for application of voltage across the liquid crystal layer;
   the second substrate has a common electrode for the application of voltage across the liquid crystal layer;
   the pixel electrode is made of a same material as a first electrode pad and formed by patterning of a layer where the first electrode pad is provided, the first electrode pad being electrically connected to the drive circuit and provided on the first substrate surface being opposed to the second substrate; and
   the common electrode is made of a same material as a second electrode pad and formed in patterning of a layer where the second electrode is provided, the second electrode pad being electrically connected to corresponding one of the plurality of input terminals and provided on the second substrate surface being opposed to the first substrate.

10. The display device as set forth in claim 9, wherein the pixel electrode has a light reflecting properly.

11. The display device as set forth in claim 1, further comprising:
    an organic light emitting layer between the first substrate and the second substrate.

12. The display device as set forth in claim 1, wherein the plurality of input terminals are provided along an edge on one side of the second substrate surface being opposed to the first substrate.

13. The method as set forth in claim 1, wherein:
    the first substrate has a memory element for storing a video signal inputted via the plurality of output terminals and the plurality of input terminals.

* * * * *